US006407895B1

(12) United States Patent
Capps

(10) Patent No.: US 6,407,895 B1
(45) Date of Patent: Jun. 18, 2002

(54) PWB ESD DISCHARGER

(75) Inventor: Charles Paul Capps, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/500,931

(22) Filed: Feb. 15, 2000

(51) Int. Cl.[7] .............................................. H02H 9/00
(52) U.S. Cl. ...................................................... 361/56
(58) Field of Search ................................... 361/56, 220

(56) References Cited

U.S. PATENT DOCUMENTS 4,915,222 A * 4/1990 Riedinger et al. .......... 206/709
5,029,041 A * 7/1991 Robinson et al. ........... 361/220
5,103,161 A * 4/1992 Bogaty ........................ 324/72

* cited by examiner

Primary Examiner—Edward H. Tso
Assistant Examiner—Pia Tibbits
(74) Attorney, Agent, or Firm—Jimmy L. Funke

(57) ABSTRACT

A method and apparatus for minimizing or eliminating electrostatic discharge damage to circuitry components on printed wiring boards. The method comprises the steps of maximizing the electric field between an input connector pin and a discharger and minimizing the impedance value between the input connector pin and discharger so that electrostatic discharge will preferentially jump from the input connector pin to the discharger, where the electrostatic discharge energy may be dissipated without adversely affecting the circuit components.

7 Claims, 1 Drawing Sheet

PWB ESD DISCHARGER

TECHNICAL FIELD

The present invention relates generally to printed wiring boards (PWB) and more specifically to an apparatus and method for limiting the effect of electrostatic discharges (ESD) on chips on a PWB.

BACKGROUND ART

Electrostatic discharge (ESD) is a problem that is prevalent in many different products and situations today. ESD is created when two different materials are brought into close proximity to each other and then separated. The process of separation causes a transfer of charges (electrons) from one material to the other.

Printed wiring boards (PWB), or circuit boards, are used in many applications, including automotive electronics such as in radios, air bag controllers, heating and air conditioning, and anti-lock brake controls. The performance of a PWB may be adversely affected by generating ESD when a PWB comes in close contact with other materials in an application. Depending on the physical circumstances, the resulting charge might flow through one or more of the electronic parts on a PWB, resulting in damage to some of the electronic parts. Engineers spend a considerable amount of time designing processes that avoid generating ESD charge, or designing circuits that direct the charge safely away from sensitive parts.

This approach has worked successfully for many years. However, as PWB boards shrink in size, and correspondingly the spaces between the materials shrink as well, different electromagnetic phenomena come into play.

It is known in the art that two charges separated by a distance have an electric field between them. That field can be described by the equation:

$$E = V/d$$

where E is the electric field that results from an ESD voltage, V is the voltage (in this case ESD voltage), and d is the spacing between the points defining the voltage. The two described charges will remain separated as long as the material between the charges (assuming the material is non-conductive) retains its nonconductive properties. However, if the voltage becomes too large, or the spacing too small, the electric field can become large enough to generate a force that literally rips electrons from the non-conductive material, and a current flows. Generally speaking, this occurs when the electric field reaches levels in the b 5MV/m range.

Not explicit in the equation is the effect of the shape of the parts on electric fields. It is well known in the art that two sharp edges will generate a much larger field between them than two blunt edges, with all else being equal, as the charge densities will be greater near the points or edges.

The current technology in the circuit board industry suggests that the size of PWBs, and correspondingly the distance between materials contained on PWBs, is increasingly growing smaller and smaller. As such, the likelihood of ESD voltages being able to jump across parts and between traces correspondingly has increased. As PWB traces typically do not have ESD protection, the potential for damage to vital components on a PWB is increased.

SUMMARY OF THE INVENTION

Thus, there is a need to provide electrostatic discharge protection of vital circuitry that accommodates the shrinking sizes of printing wiring boards.

It is, therefore, one object of the present invention to maximize the field between any trace ESD currents that might flow and the ground, thus allowing ESD energy with voltages above breakdown voltage to jump to the ground and away from any vital electronic components on the PWB.

It is another object of the present invention to adjust the impedance, which is defined as the total opposition that a circuit presents to an alternating current, between the ESD ground and the trace ESD currents on a PWB, such that an ESD breakdown voltage will jump to the ESD ground and away from vital electronic components on the PWB.

A PWB in accordance with the present invention has one or more dischargers having a size and configuration that maximizes the electric field between the discharger and any input connector pins, such that the electrostatic discharge would preferentially jump from input connector pin to discharger and be harmlessly dissipated through the ground. Such dischargers, or extensions thereof, are provided with electric field increasing features such as sharp points or edges located adjacent and directed at the input connector pins to maximize the electric field therebetween. The PWB may further have additional dischargers with similar features located in alternative locations near traces, such that electrostatic discharge would preferentially jump from traces to discharger and be harmlessly dissipated through the ground.

Other features and advantages of the present invention will become apparent from the following detailed description that should be read in conjunction with the accompanying drawings.

BEST MODE(S) FOR CARRYING OUT THE INVENTION

Figure 1:
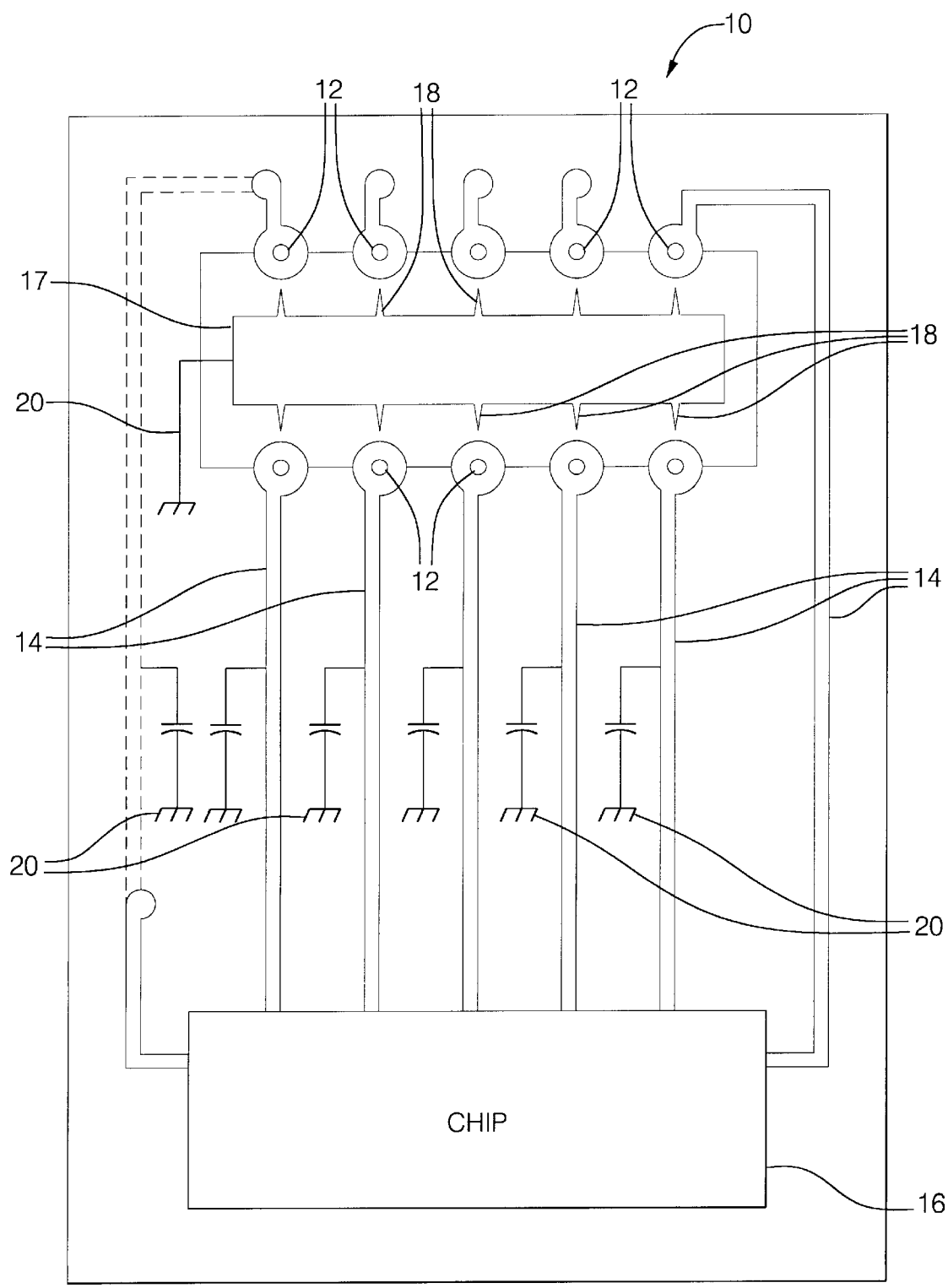
FIG. 1 illustrates a printed wiring board according to a preferred embodiment of the present invention.

Referring now to FIG. 1, a printed wiring board (PWB) 10 according to a preferred embodiment is shown. The PWB 10 has a series of input connector pins 12 for receiving electrical signals. The electrical signals travel along a trace 14 to a chip 16, where the electrical signals are processed. The chips 16 can be any type of analog, digital or other silicon-based chips or galium arsinide-based chip that are commonly known or used in the industry. The PWB 10 also contains an insulating material (or conformal coating (not shown)) that is applied to the entire board 10 during assembly to avoid short circuits that are associated with moisture buildup.

A discharger 17 is closely electrically coupled to the input connector pins 12 such that electrostatic discharge will preferably jump from the pin 12 to the discharger 17 to prevent damage to the chip 16. The discharger 17 is coupled to a ground 20 for dissipating the electrostatic discharge. The discharger 17 is preferably composed of copper or some other conductive material.

In a preferred embodiment of the present invention, the size and configuration of the discharger 17 are changed to maximize the electric field between the discharger 17 and the input connector pin 12. In this regard, the configuration of the discharger 17 is changed to provide one or more discharger extensions 18, each such discharger extension having a sharp point or edge. The sharp point or edge of each discharger extension 18 is located close to an input The size of the discharger extension 18 can also be increased, causing a corresponding increase in the electric field between the discharger 18 and the input connector pins 12.

While FIG. 1 shows the discharger 18 being located at a position nearest to the input connector pin 12, it is contemplated that additional dischargers 18 may be placed in other locations not closely electrically coupled to the input connector pin 12 to ensure that electrostatic discharge does not jump from trace 14 to trace 14, especially near sharp edges on traces 14 or other portions of the circuitry.

While a number of embodiments of the present invention have been shown, it will be understood, of course, that the invention is not limited thereto since modifications may be made by those skilled in the art, particularly in light of the following teachings. It is therefore contemplated by the appended claims to cover any such modifications as incorporate those features that constitute the essential features of these improvements within the true spirit and scope of the invention.

What is claimed is:

1. A method of minimizing damage to circuitry components on a printed wiring board due to electrostatic discharge, the method comprising the steps of:

determining an electronic field value between an input connector pin and a discharger; and adjusting a configuration of said discharger by providing a sharp point on said discharger, where said sharp edge is located in closest proximity with said input connector pin and directed at said input connector pin, to maximize said electronic field value.

2. A printed wiring board that protects circuitry components from electrostatic discharge, the printed wiring board comprising:

a chip for processing electrical signals;

at least one input connector pin;

a trace situated between said input connector pin and said chip;

a discharger electrically coupled to said input connector pin, said discharger having a configuration comprising an electric field concentrating feature directed at said input connector pin; and a ground coupled to said discharger.

3. The printed wiring board of claim 2 further comprising at least one second discharger coupled to a second ground, the second discharger being positioned adjacent to said trace and having an electric field concentrating feature directed at said trace.

4. The printed wiring board of claim 3 wherein said electric field concentrating feature of said second discharger defines a sharp point adjacent and directed at said trace.

5. The printed wiring board of claim 2 wherein said electric field concentrating feature of said discharger configuration defines a sharp point adjacent and directed at said input connector pin.

6. A printed wiring board that protects circuitry components from electrostatic discharge, the printed wiring board comprising:

a chip for processing electrical signals;

a plurality of input connector pins;

a trace situated between each of said input connector pins and said chip;

a discharger having a plurality of extensions electrically coupled to said input connector pins, each of said extensions being disposed adjacent one of said input connector pins and having a configuration defining an electric field concentrating feature with respect to said one of said input connector pins; and a ground coupled to said discharger.

7. The printed wiring board of claim 6 wherein each of said field concentrating features defines a sharp point directed at said one of said input connector pins.

* * * * *